United States Patent
Eichler et al.

(10) Patent No.: US 12,439,737 B2
(45) Date of Patent: Oct. 7, 2025

(54) RADIATION-EMITTING SEMICONDUCTOR CHIP AND METHOD FOR PRODUCING A RADIATION-EMITTING SEMICONDUCTOR CHIP

(71) Applicant: ams-OSRAM International GmbH, Regensburg (DE)

(72) Inventors: Christoph Eichler, Donaustauf (DE); Lars Nähle, Bad Abbach (DE); Sven Gerhard, Alteglofsheim (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 437 days.

(21) Appl. No.: 17/924,288

(22) PCT Filed: May 10, 2021

(86) PCT No.: PCT/EP2021/062303
§ 371 (c)(1),
(2) Date: Nov. 9, 2022

(87) PCT Pub. No.: WO2021/228755
PCT Pub. Date: Nov. 18, 2021

(65) Prior Publication Data
US 2023/0197893 A1 Jun. 22, 2023

(30) Foreign Application Priority Data
May 12, 2020 (DE) ............ 10 2020 205 940.3

(51) Int. Cl.
*H10H 20/814* (2025.01)
*H01L 25/075* (2006.01)
(Continued)

(52) U.S. Cl.
CPC ....... *H10H 20/814* (2025.01); *H01L 25/0753* (2013.01); *H01S 5/0071* (2013.01);
(Continued)

(58) Field of Classification Search
CPC .. H01L 25/0753; H10H 20/01; H10H 20/857; H10H 20/0363; H10H 20/034;
(Continued)

(56) References Cited

U.S. PATENT DOCUMENTS

| 2003/0039286 A1* | 2/2003 | Doi ............ H01S 5/0202 438/22 |
| 2004/0233950 A1 | 11/2004 | Furukawa et al. |

(Continued)

FOREIGN PATENT DOCUMENTS

| DE | 102018111319 A1 | 11/2019 |
| DE | 102020118405 A1 | 1/2022 |

(Continued)

OTHER PUBLICATIONS

Japanese Office Action issued in corresponding Japanese Patent Application No. 2022-568773 mailed on Dec. 20, 2023, with English language translation, 8 pages.

(Continued)

*Primary Examiner* — Victor A Mandala
(74) *Attorney, Agent, or Firm* — MH2 Technology Law Group LLP

(57) ABSTRACT

The invention relates to a radiation-emitting semiconductor chip, having: a semiconductor body comprising an active region which is designed to generate electromagnetic radiation; a resonator which comprises a first end region and a second end region; and at least one cut-out in the semiconductor body, said cut-out passing completely through the active region, wherein: the active region is situated in the resonator, and the cut-out defines a reflectivity for the electromagnetic radiation. The invention also relates to a radiation-emitting semiconductor component, a method for (Continued)

Figure 1:
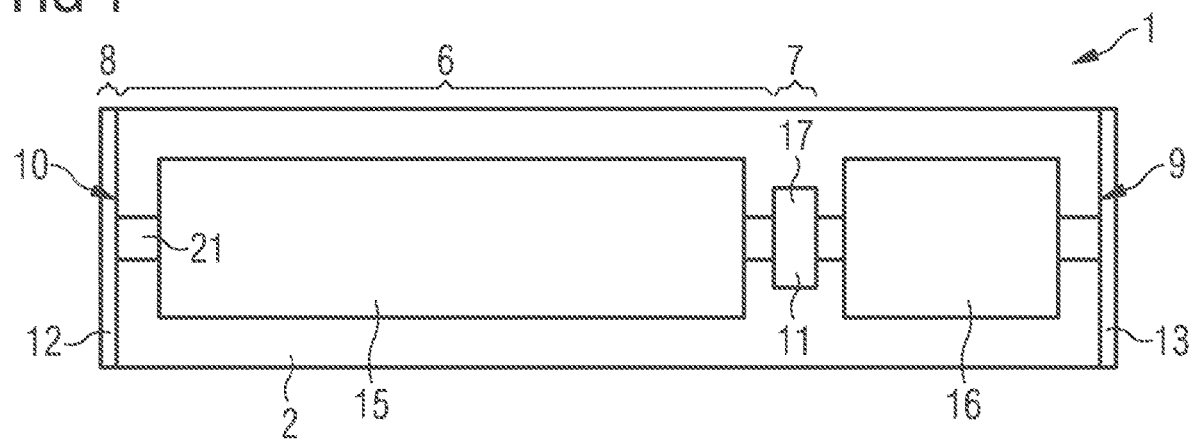

producing a radiation-emitting semiconductor chip, and a method for producing radiation-emitting semiconductor components.

12 Claims, 16 Drawing Sheets

(51) Int. Cl.
  *H01S 5/00* (2006.01)
  *H01S 5/02* (2006.01)
  *H01S 5/40* (2006.01)
  *H10H 20/01* (2025.01)
  *H10H 20/857* (2025.01)
(52) U.S. Cl.
  CPC ............. *H01S 5/0203* (2013.01); *H01S 5/40* (2013.01); *H10H 20/01* (2025.01); *H10H 20/857* (2025.01); *H10H 20/0363* (2025.01)
(58) Field of Classification Search
  CPC ............ H10H 20/042; H10H 20/8142; H10H 20/814; H01S 5/0286; H01S 5/209; H01S 5/0201; H01S 5/026; H01S 5/0265; H01S 5/0287; H01S 5/0625; H01S 5/2086; H01S 5/4031; H01S 5/0071; H01S 5/0203; H01S 5/40
  See application file for complete search history.

(56) References Cited

U.S. PATENT DOCUMENTS

| | | | |
|---|---|---|---|
| 2007/0071049 A1* | 3/2007 | Kohara | H01S 5/026 372/43.01 |
| 2007/0253457 A1* | 11/2007 | Kashima | H01S 5/22 372/50.121 |
| 2010/0290489 A1* | 11/2010 | Agresti | H01S 5/12 372/96 |
| 2018/0316160 A1* | 11/2018 | Raring | H01S 5/02257 |
| 2018/0366912 A1* | 12/2018 | Hashimoto | H01S 5/22 |
| 2019/0165541 A1* | 5/2019 | Watanabe | H01S 5/2275 |
| 2019/0221999 A1* | 7/2019 | Kawakami | H01S 5/2202 |
| 2019/0285975 A1* | 9/2019 | Fujii | G03B 21/2006 |
| 2019/0323663 A1* | 10/2019 | Rudy | H01S 5/0233 |
| 2019/0356108 A1 | 11/2019 | Matsuhama | |
| 2020/0232618 A1* | 7/2020 | Rudy | B60Q 3/62 |
| 2020/0233292 A1* | 7/2020 | Rudy | G03B 21/2033 |

FOREIGN PATENT DOCUMENTS

| | | |
|---|---|---|
| EP | 1304778 A2 | 4/2003 |
| EP | 2302747 A1 | 3/2011 |
| JP | S61-267387 A | 11/1986 |
| JP | S63-302586 A | 12/1988 |
| JP | 2019125738 A | 7/2019 |
| WO | 2020144226 A1 | 7/2020 |

OTHER PUBLICATIONS

Office Action issued in German Patent Application No. 11 2021 002 697.6 dated Jul. 4, 2024, 10 pages, with English language translation.

De Kroon, Arnoud (EP Authorized Officer), International Search Report and Written Opinion in corresponding International Application No. PCT/EP2021/062303 mailed on Aug. 19, 2021, 18 pages.

* cited by examiner

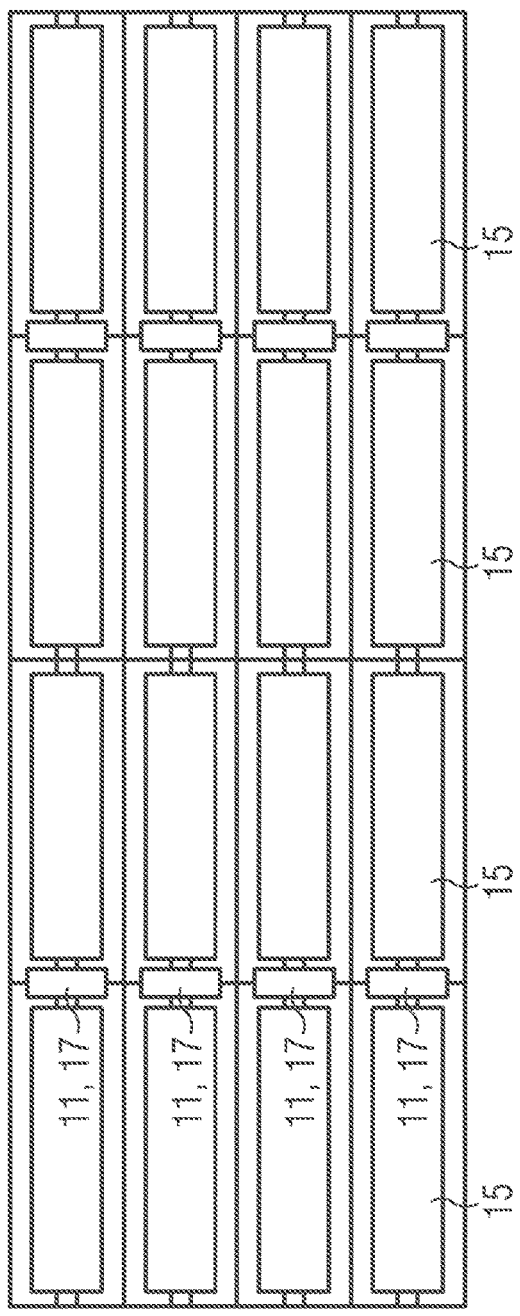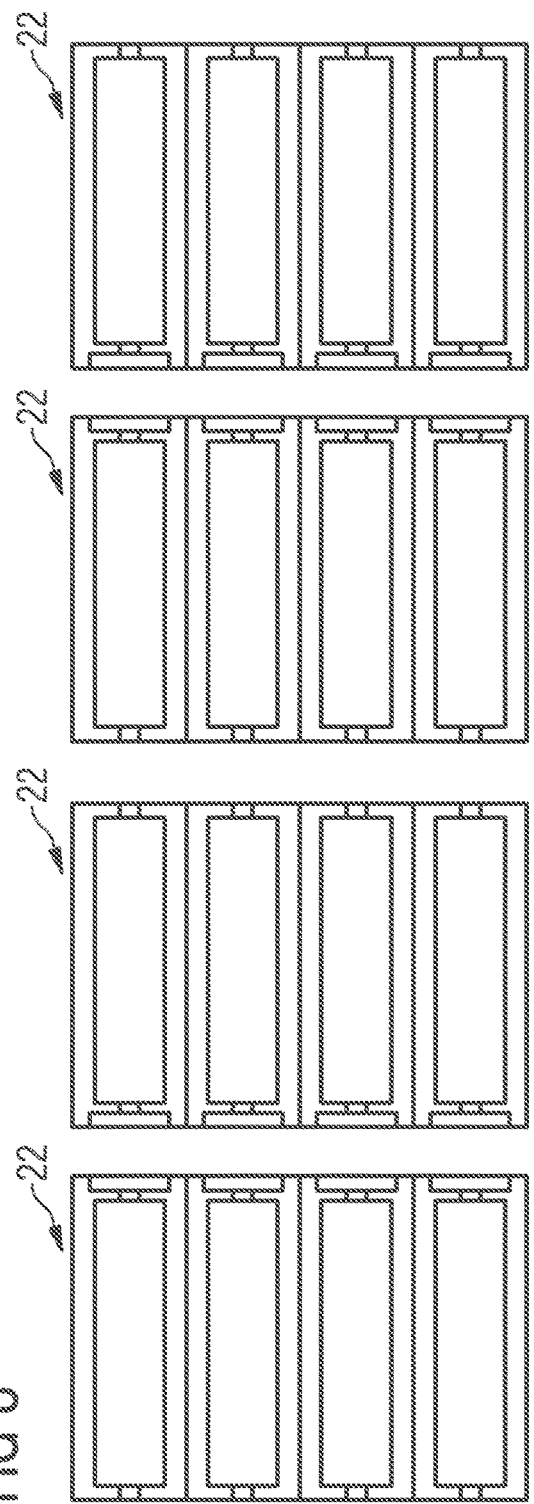

RADIATION-EMITTING SEMICONDUCTOR CHIP AND METHOD FOR PRODUCING A RADIATION-EMITTING SEMICONDUCTOR CHIP

CROSS-REFERENCE TO RELATED APPLICATIONS

The present application is a national stage entry from International Application No. PCT/EP2021/062303, filed on May 10, 2021, published as International Publication No. WO 2021/228775 A1 on Nov. 18, 2021, and claims priority to German Patent Application 10 2020 205 940.3 filed May 12, 2020, the disclosures of all of which are hereby incorporated by reference herein in their entireties.

FIELD OF THE INVENTION

A radiation-emitting semiconductor chip is specified. In addition, a method for producing a radiation-emitting semiconductor chip is specified.

BACKGROUND OF THE INVENTION

An object to be solved is to specify an improved radiation-emitting semiconductor chip. In addition, a method for producing such a semiconductor chip is to be specified.

These objects are solved by a semiconductor chip with the features of patent claim 1 and by a method with the steps of patent claim 10. Advantageous embodiments of the semiconductor chip and of the method for producing the semiconductor chip are the subject matter of the respective dependent claims.

SUMMARY OF THE INVENTION

According to one embodiment, the semiconductor chip comprises a semiconductor body with an active region configured to generate electromagnetic radiation. Preferably, the semiconductor body extends in lateral direction between a first end face of the semiconductor body and a second end face of the semiconductor body. According to at least one embodiment of the semiconductor chip, the active region is arranged in the resonator.

According to one embodiment, the semiconductor chip comprises a resonator comprising a first end region and a second end region.

According to one embodiment, the semiconductor chip comprises at least one recess in the semiconductor body that completely penetrates the active region. The recess preferably has side surfaces that extend in a vertical direction.

According to one embodiment of the semiconductor chip, the recess presets a reflectivity for the electromagnetic radiation. Depending on the reflectivity, the semiconductor chip is, for example, a semiconductor laser diode or a superluminescent light-emitting diode, SLED for short. If the semiconductor chip is a SLED, the generated radiation in the resonator is amplified to superluminescent radiation. If the semiconductor chip is a laser diode, the generated radiation is amplified in the resonator to laser radiation.

According to one embodiment of the semiconductor chip, a highly reflective mirror layer is arranged on the semiconductor body in the second end region. The highly reflective mirror layer preferably has a reflectivity of at least 95%, in particular at least 99%, for radiation generated in the active region.

According to one embodiment of the semiconductor chip, the recess is arranged in the first end region. In this embodiment, the recess is preferably configured to predetermine properties of the radiation emitted by the semiconductor chip.

If the semiconductor chip is an SLED, the recess has for the radiation and/or superluminescent radiation generated in the active region preferably a reflectivity of at most 10%, in particular at most 1%. If the semiconductor chip is a laser diode, the recess has for the radiation and/or laser radiation generated in the active region preferably a reflectivity of at most 90%, in particular at most 10%.

If the recess is arranged in the first end region, an anti-reflective layer is preferably arranged on the first end face. The anti-reflective layer preferably has a reflectivity of at most 1%, in particular at most 0.01%, for the radiation generated in the active region.

According to one embodiment of the semiconductor chip, the recess is arranged between the first end region and the second end region. In this embodiment, the recess is preferably configured to electrically isolate regions of the semiconductor chip from one another. In this embodiment, the recess preferably has a reflectivity of at most 1%, in particular at most 0.01%, for the radiation generated in the active region.

If the recess is arranged between the first end region and the second end region, a partially reflective layer is preferably arranged on the first end face. The partially reflective layer preferably has a reflectivity of at most 90%, in particular at most 10%, for the radiation generated in the active region.

According to one embodiment of the semiconductor chip, a first contact layer is arranged on the semiconductor body and is configured to impress a current into the semiconductor body.

According to one embodiment of the semiconductor chip, a second contact layer is arranged on the semiconductor body. In this embodiment, the semiconductor chip is a segmented semiconductor laser.

According to one embodiment of the semiconductor chip, the recess is arranged between the first contact layer and the second contact layer.

According to one embodiment of the semiconductor chip, a dielectric layer is arranged in the recess.

According to one embodiment of the semiconductor chip, the dielectric layer completely covers at least one side surface of the recess. Preferably, the dielectric layer is in direct contact with the side surface of the recess.

According to one embodiment of the semiconductor chip, the dielectric layer is spaced apart from each side surface of the recess.

According to one embodiment of the semiconductor chip, a further dielectric layer is arranged on the dielectric layer. The further dielectric layer is preferably in direct contact with the dielectric layer.

According to one embodiment of the semiconductor chip, the further dielectric layer is arranged on at least one side surface of the recess. For example, the dielectric layer is arranged between the further dielectric layer and the side surface of the recess. Alternatively, the further dielectric layer is in direct contact with the side surface of the recess.

According to one embodiment of the semiconductor chip, the further dielectric layer is spaced apart from each side surface of the recess.

According to one embodiment of the semiconductor chip, a waveguide structure is arranged in the recess in which the dielectric layer and/or the further dielectric layer is arranged.

The waveguide structure preferably has the same refractive indices as the semiconductor body.

In addition, a radiation-emitting semiconductor device comprising at least two of the semiconductor chips described herein is specified. According to one embodiment, the semiconductor chips are arranged next to one another in lateral direction.

A method for producing a semiconductor chip is further specified, by which a semiconductor chip described herein can be manufactured.

All features and embodiments disclosed in connection with the semiconductor chip are therefore also applicable in connection with the method and/or the semiconductor device, and vice versa.

According to one embodiment of the method, a semiconductor body comprising an active region configured to generate electromagnetic radiation is provided.

According to one embodiment of the process, a recess is generated in the semiconductor body that completely penetrates the active region. Preferably, a target width $ds_{oll}$ of the recesses is determined by the following formula: $ds_{oll}=m*\lambda/(n_{HL}(4-0.33588*\sqrt{R}))$, where m is an odd natural number, $\lambda$ is a wavelength of the radiation in the recess, $n_{HL}$ is a refractive index of the semiconductor body, and R is a reflectivity to be preset. Furthermore, $n_{HL}$ has a tolerance of at most +−10% and $ds_{oll}$ has a tolerance of at most +−50%.

According to one embodiment of the method, a resonator is generated comprising a first end region and a second end region, wherein the active region is arranged in the resonator.

According to one embodiment of the method, the recess presets a reflectivity for the electromagnetic radiation. Preferably, after the recess is generated, a width in the lateral direction of the recess is determined. For example, the recess is etched and is preferably wider than $\lambda/4$. For example, the recess has a width of at most 10 µm, in particular at most 2 µm. After determining the width of the recess, a width of the dielectric layer to be applied and/or a width of the further dielectric layer to be applied is determined as a function of the width of the recess, e.g. by a transfer matrix method. Process variations with regard to a reflectivity at cleaving edges or recesses can advantageously be subsequently compensated by the specified method, resulting in better yields and thus lower costs.

Furthermore, a method for producing semiconductor devices is specified by which a semiconductor device described herein can be produced. All features and embodiments disclosed in connection with the method are therefore also applicable in connection with the method for producing the semiconductor chip, the semiconductor chip and/or the semiconductor device, and vice versa.

According to one embodiment of the method, a semiconductor wafer comprising active regions each configured to generate electromagnetic radiation is provided.

According to one embodiment of the method, recesses are generated in the semiconductor wafer, which completely penetrate each of the active regions. For example, the recesses are arranged matrix-like, along rows and columns.

According to one embodiment of the method, resonators are generated each comprising a first end region and a second end region, wherein one of the active regions is arranged in one of the resonators, respectively.

According to one embodiment of the method, the semiconductor wafer is singulated into semiconductor devices. For example, the semiconductor wafer is singulated by sawing, laser cutting, stealth dicing or breaking.

According to one embodiment of the method, the recesses, each adjacent to one of the resonators, preset a first reflectivity for the electromagnetic radiation in the first end region and a second reflectivity for the electromagnetic radiation in the second end region.

According to at least one embodiment of the method, a layer stack is generated in the recesses. The layer stack comprises, for example, a stack of a plurality of dielectric layers. Between the dielectric layers of the layer stack, one or more intermediate layers can further be arranged, such as a metal layer or a semiconductor layer. Additionally or alternatively, the intermediate layer can be arranged on an outer dielectric layer of the layer stack. The dielectric layers of the layer stack are formed at least partially differently from each other. For example, the dielectric layers of the layer stack comprise at least partially different materials and/or are formed with at least partially different thicknesses.

Further, a metallic layer can subsequently be generated on the layer stack in the recesses. The metallic layer comprises or consists of at least one metal. For example, the metallic layer is formed reflective for the generated radiation. In this case, the metallic layer has a reflectivity for the generated radiation of at least 90%, in particular of at least 95% or 98%.

According to at least one embodiment of the method, a mask layer is applied to the layer stack.

According to at least one embodiment of the method, the mask layer covers in each case a first region of the layer stack in the recesses.

According to at least one embodiment of the method, the layer stack is at least partially removed in each case in a second region in the recesses. Furthermore, the metallic layer is also completely removed in each case in the second region in the recesses.

According to at least one embodiment of the method, the layer stack has an etch stop layer arranged between dielectric layers of the layer stack. For example, the layer stack is removed by an etching process up to the etch stop layer.

The etch stop layer is formed here, for example, with an etch-resistant layer. Alternatively, the etch stop layer is a predetermined layer with a predetermined material composition. In this case, the layer stack in the second region in the recess is at least partially removed dependent on a predetermined material composition of the etch stop layer. For example, the etch stop layer is not formed to be etch resistant. If the predetermined material composition of the etch stop layer is detected during etching, for example, the etching process is stopped.

The first region and the second region each extend from a side surface of the recess to a center of the recess. For example, the first region and the second region have the same width. Alternatively, the widths of the first region and the second region are different from one another.

According to at least one embodiment of the method, a further layer stack is generated in the recesses on the mask layer and the layer stack. The further layer stack can comprise further dielectric layers and/or further intermediate layers. The further layer stack is completely removed in each case in the first region in the recesses. For example, the metallic layer is also completely removed in each case in the first region in the recesses. In this case, the further layer stack is removed by removing the mask layer. This is a lift-off process, for example.

According to at least one embodiment of the method, the semiconductor wafer is singulated through the recesses. For example, singulation can be performed between the first region and the second region. Alternatively, singulation can be performed by a cut through the first region or by a cut through the second region.

According to at least one embodiment of the method, the layer stack in the first regions presets in each case the first reflectivity and the layer stack in the second regions presets in each case the second reflectivity.

Alternatively, the layer stack and the metallic layer presets in each case the first reflectivity in the first regions, for example, and the layer stack presets in each case the second reflectivity in the second regions.

Alternatively, the layer stack presets in each case, for example, the first reflectivity in the first regions, and the layer stack and the further layer stack presets in each case the second reflectivity in the second regions.

For example, the layer stack is formed highly reflective in the first region for the radiation generated in the active region. In this case, the first reflectivity has a reflectivity for the generated radiation of at least 90%, in particular at least 95% or 98%.

For example, the layer stack is formed anti-reflective in the second region for the radiation generated in the active region. In this case, the second reflectivity has a reflectivity for the generated radiation of at most 80%, at most 50% or at most 20%, in particular at most 1% or at most 0.01%. For example, if green light is generated, the reflectivity is at most 80%, and if blue light is generated, the reflectivity is at most 50%.

The semiconductor devices produced in this way can subsequently be singulated to semiconductor chips.

DETAILED DESCRIPTION

In the following, the semiconductor chip described herein, the semiconductor device, and the method for producing the semiconductor chip described herein are explained in more detail with reference to exemplary embodiments and the accompanying Figures.

FIG. 1 shows a top view of a semiconductor chip 1 according to an exemplary embodiment with a semiconductor body 2 comprising a ridge 21. Furthermore, a first contact layer 15 and a second contact layer 16 are arranged on the semiconductor body 2. Between the contact layers 15 and 16, a recess 11 is arranged in which a dielectric layer 17 is arranged. The semiconductor body 2 extends from a first end face 9 to a second end face 10. An anti-reflective layer 13 is arranged on the first end face 9 and a highly reflective mirror layer 12 is arranged on the second end face 10. In addition, a resonator 6 extends between a first end region 7 and a second end region 8.

Constant current is supplied to the semiconductor body 2 through the first contact layer 15, while radiation generated by an active region 3 is modulated through the second contact layer 16.

Figure 2:
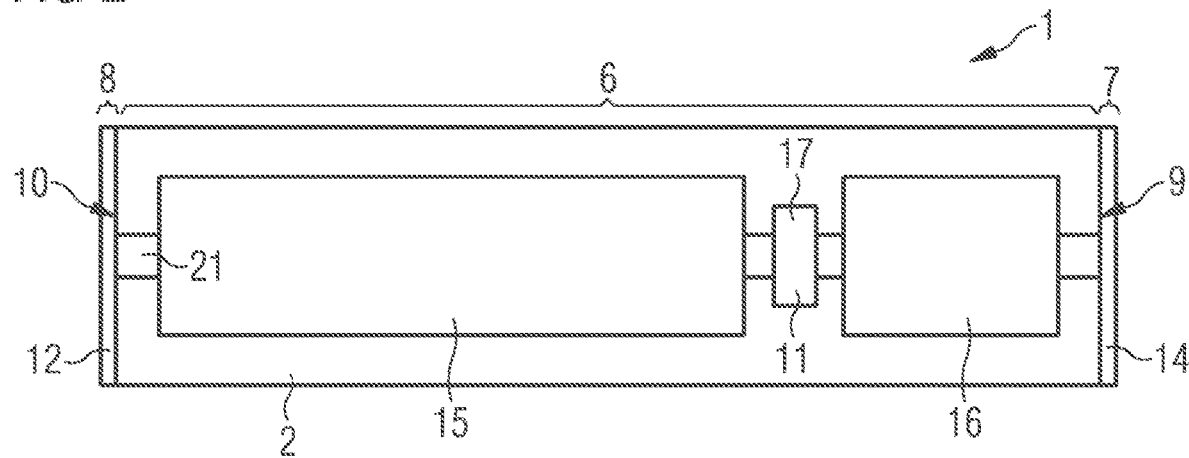

FIG. 2 shows a top view of a semiconductor chip 1 according to a further exemplary embodiment in which the resonator 6 extends between a first end face 9 and a second end face 10. For example, the semiconductor chip 1 can be turned on and off by operating the second contact layer 16. Higher switching speeds can thus advantageously be achieved.

Figure 3:
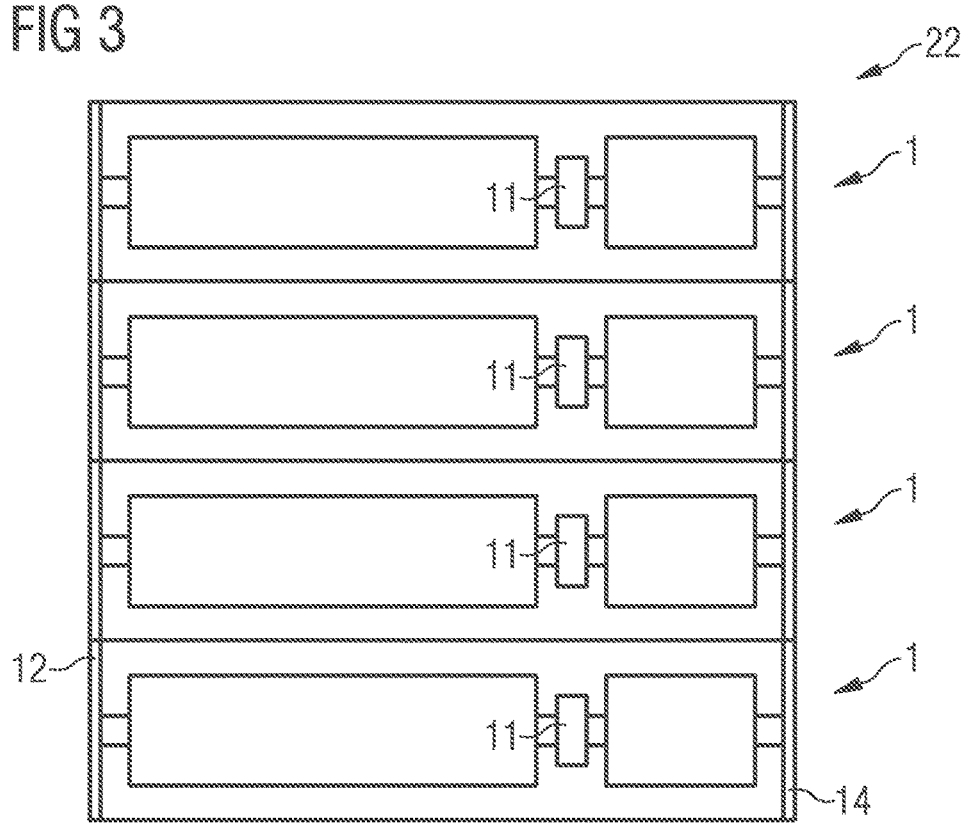

FIG. 3 shows a top view of a semiconductor device 22 according to an exemplary embodiment with four semiconductor chips 1 according to FIG. 2. At least two of the recesses 11 can have different reflectivities. Thus, differences caused by different thermal coupling of the semiconductor chips 1 can be compensated. The recesses 11 of the inner semiconductor chips 1 can have a higher reflectivity than the recesses 11 of the outer semiconductor chips 1, since these are cooled more poorly and thus have a higher laser threshold.

Figure 4:
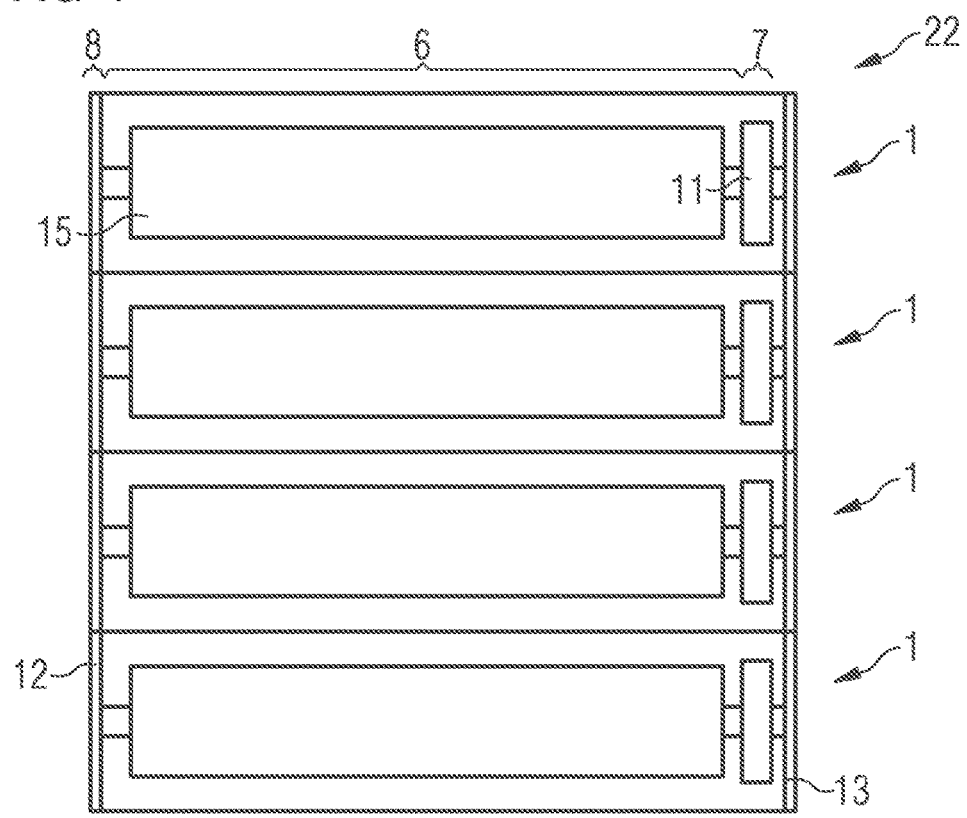

FIG. 4 shows a top view of a semiconductor device 22 according to an exemplary embodiment with four semiconductor chips 1 which, in contrast to FIG. 1, exclusively have a first contact layer 16.

Figure 5:
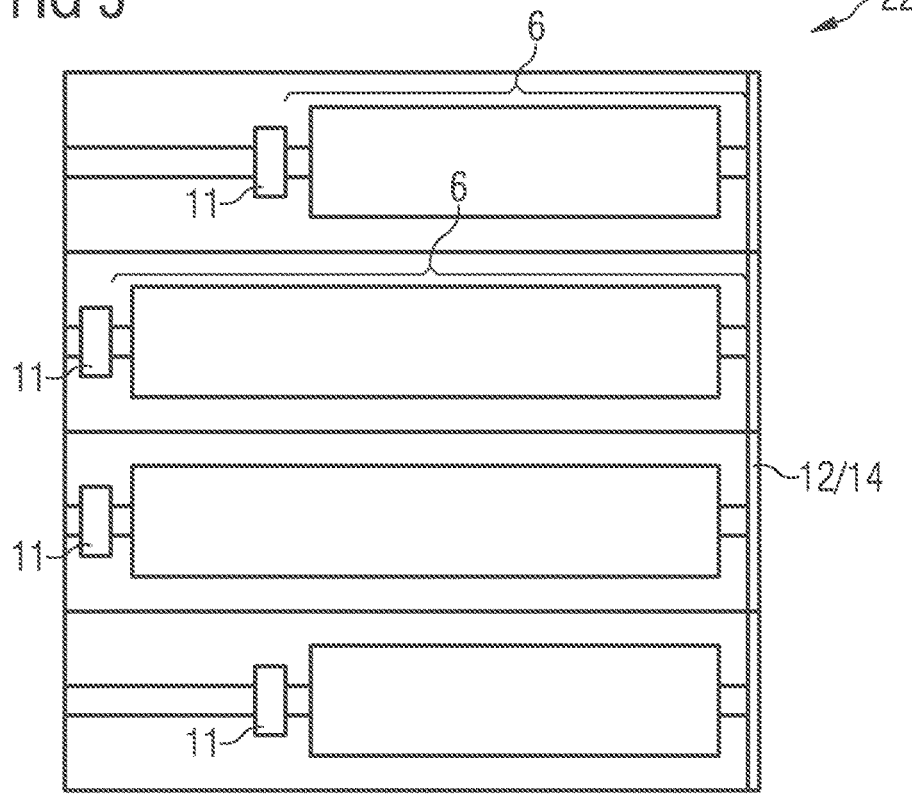
Figure 6:
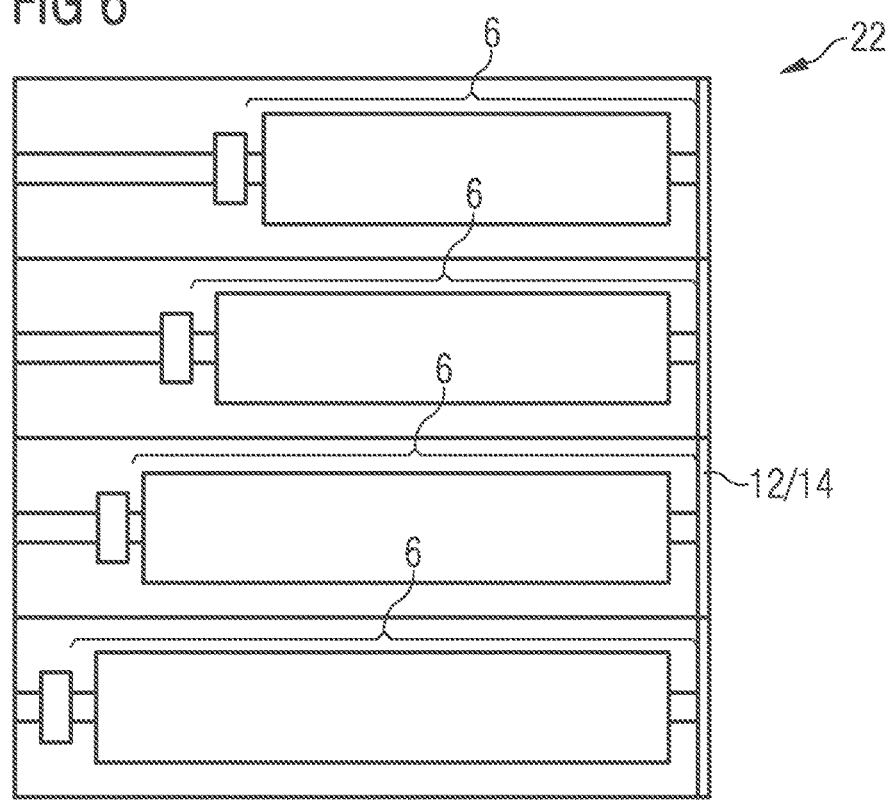
Figure 9:
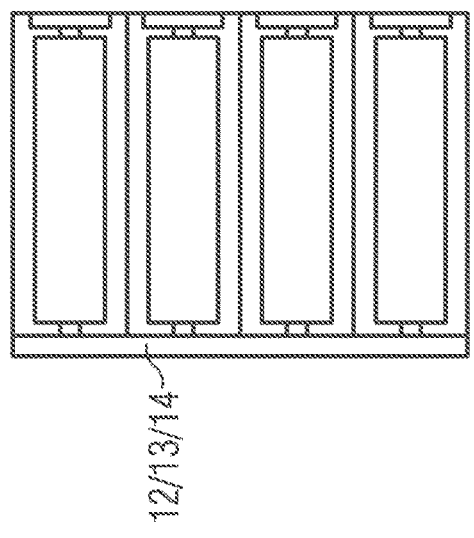
Figure 10:
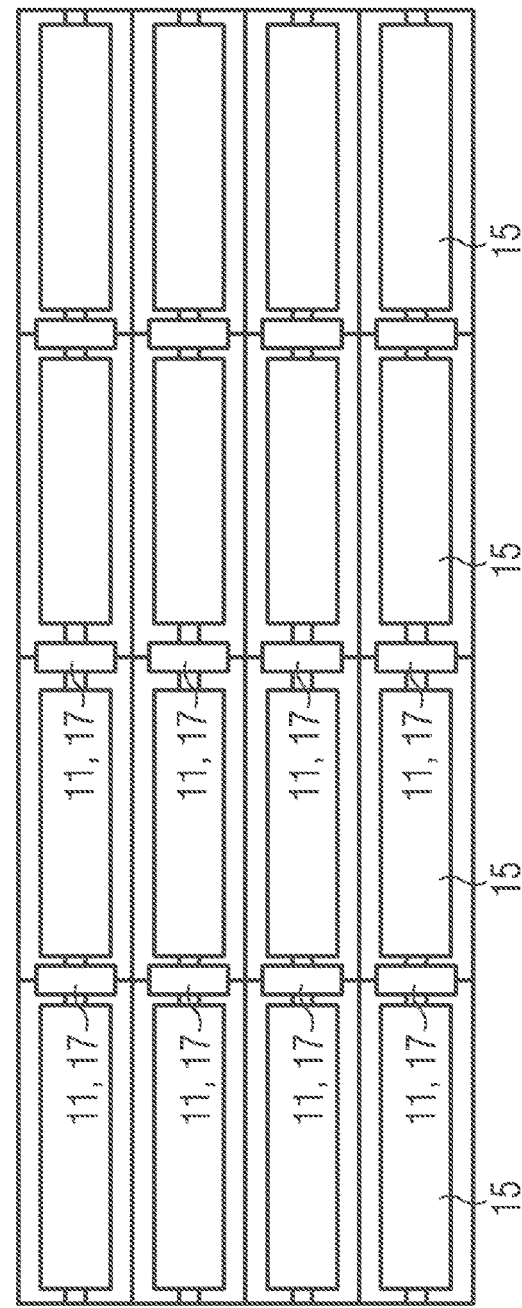
Figure 11:
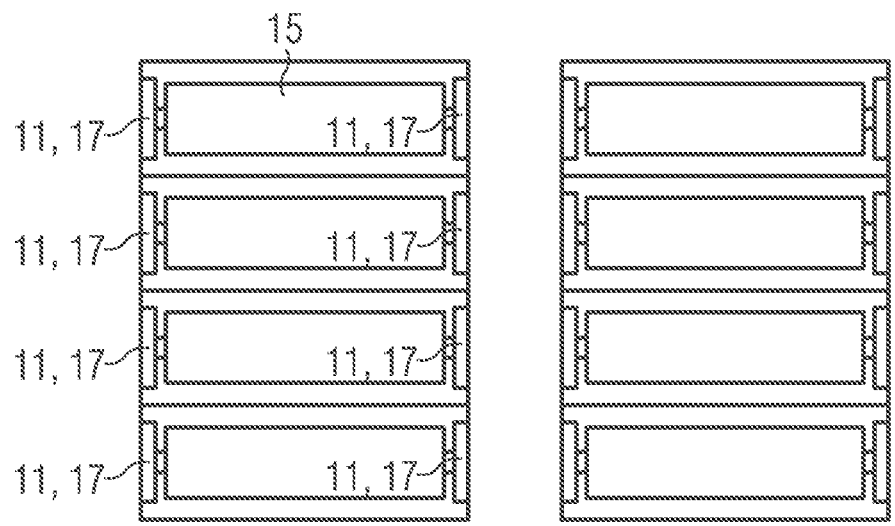

FIGS. 5 and 6 each show a top view of a semiconductor device 22 according to an exemplary embodiment, wherein the resonators 6 of the semiconductor chips 1 each have different lengths.

FIGS. 7, 8 and 9 and FIGS. 10 and 11 show method stages for producing a semiconductor device 22. Initially, first recesses 11 are generated at wafer level (FIG. 7). A dielectric layer 17 is introduced in each of the recesses 11. Subsequently, the semiconductor chips 1 are singulated at wafer level to form semiconductor devices 22.

FIGS. 12, 13, 14, 15, 16, 17, 18, 19 and 20 each show a sectional view of a recess 11 in which a dielectric layer 17 is arranged. FIGS. 21, 22, 23, 24, 25, 26 and 27 each show a sectional view of a recess 11 in which a dielectric layer 17 and a further dielectric layer 18 are arranged.

Figure 28:
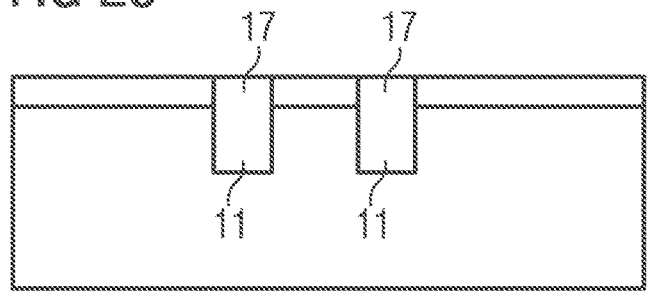
Figure 29:
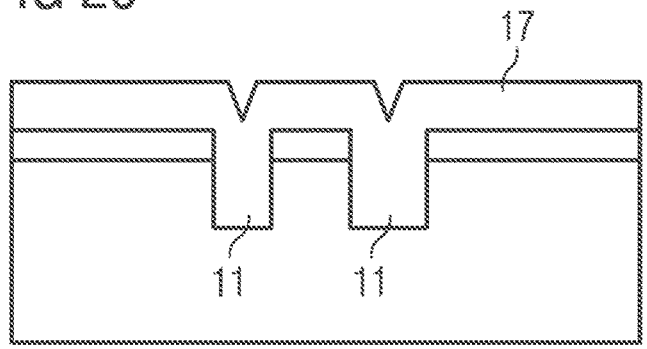

FIGS. 28 and 29 each show a sectional view of two recesses 11 in a semiconductor chip 1 in which a dielectric layer 17 is arranged.

Figure 30:
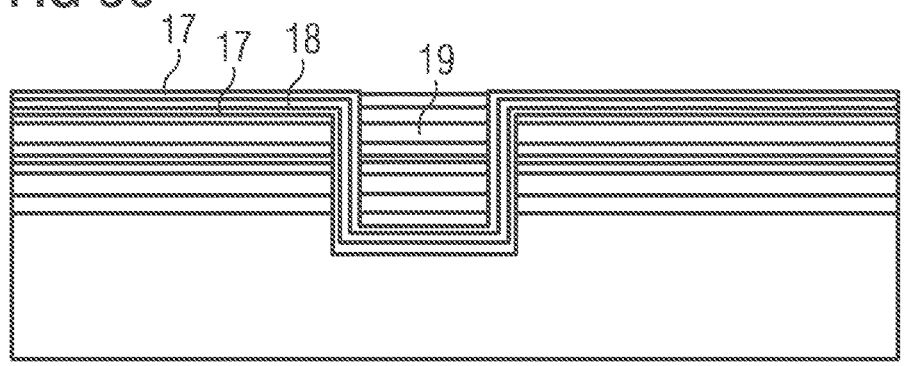

FIG. 30 shows a sectional view of a recess 11 in which a waveguide structure 19 is arranged.

Figure 12:
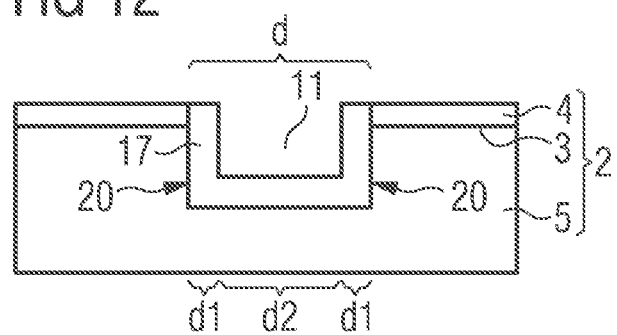
Figure 13:
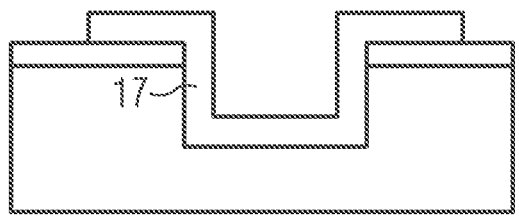
Figure 14:
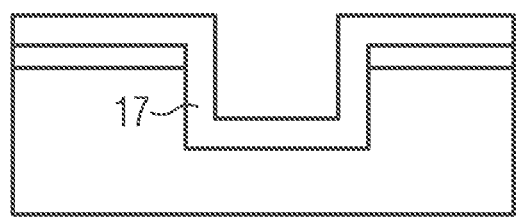
Figure 15:
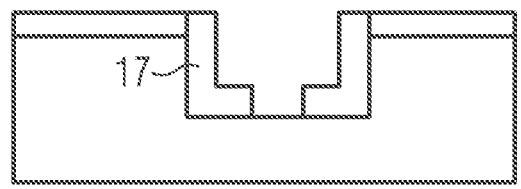
Figure 16:
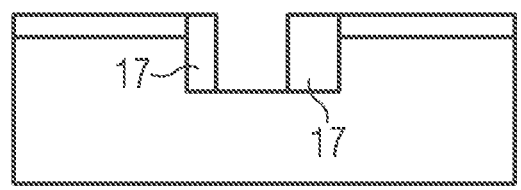
Figure 17:
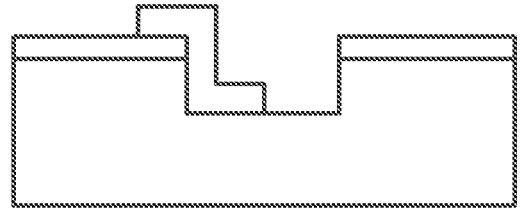
Figure 18:
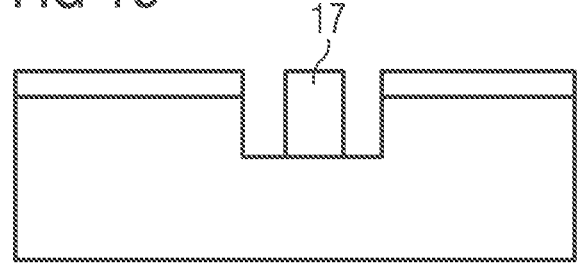
Figure 31:
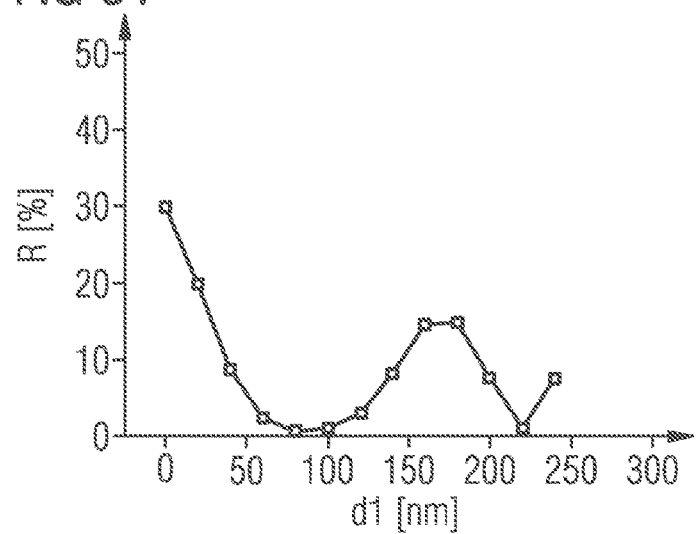
Figure 32:
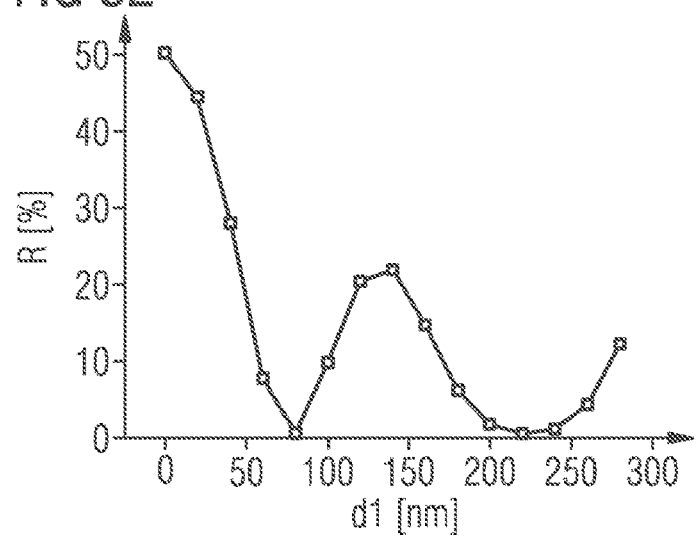
Figure 33:
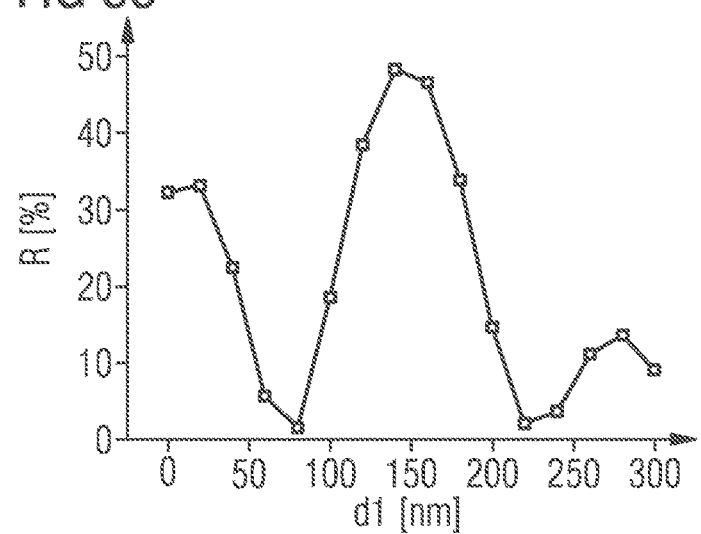

FIGS. 31, 32 and 33 show exemplary diagrams of a reflectivity R for radiation at a recess 11 with a dielectric layer 17, for example SiO$_2$, as shown in FIGS. 12 and 13. The width d1 is the width of a dielectric layer 17 arranged on a side surface of the recess 20. In FIG. 31, the width of the recess is d=d1+d2+d1=500 nm, a refractive index of the semiconductor body is $n_{HL}$=2.4, and a refractive index of the dielectric layer is $n_M$=1.5. In contrast, in FIG. 31, the width of the recess is d=d1+d2+d1 =560 nm, and in FIG. 33, d=d1+d2+d1=620 nm. Preferably, a width d1 is selected at which there is a local maximum or minimum reflectivity, so that small changes of the width do not have a significant effect on the reflectivity.

Figure 34:
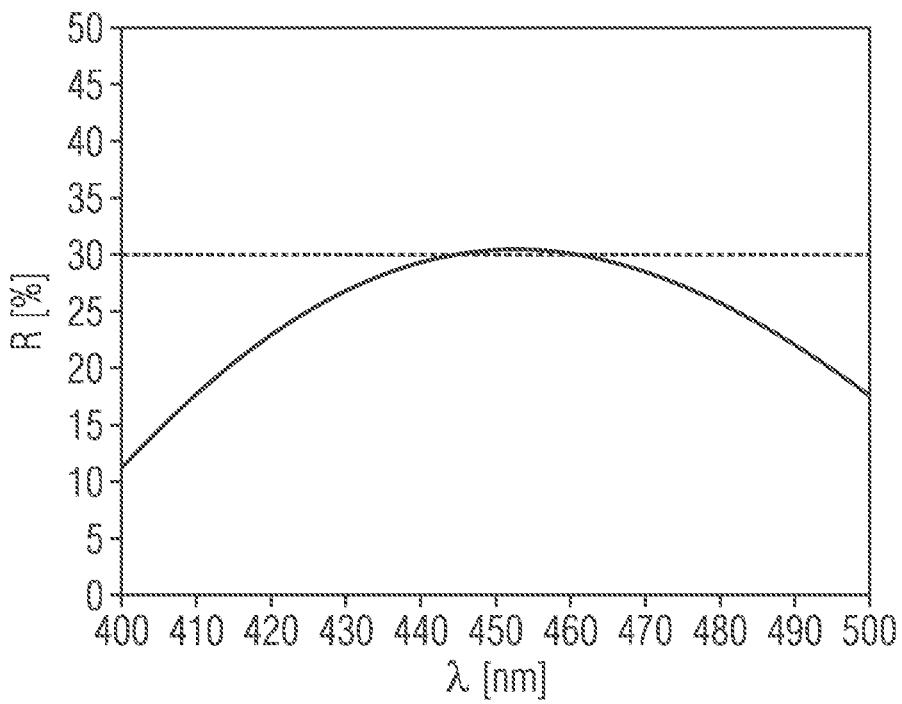
Figure 35:
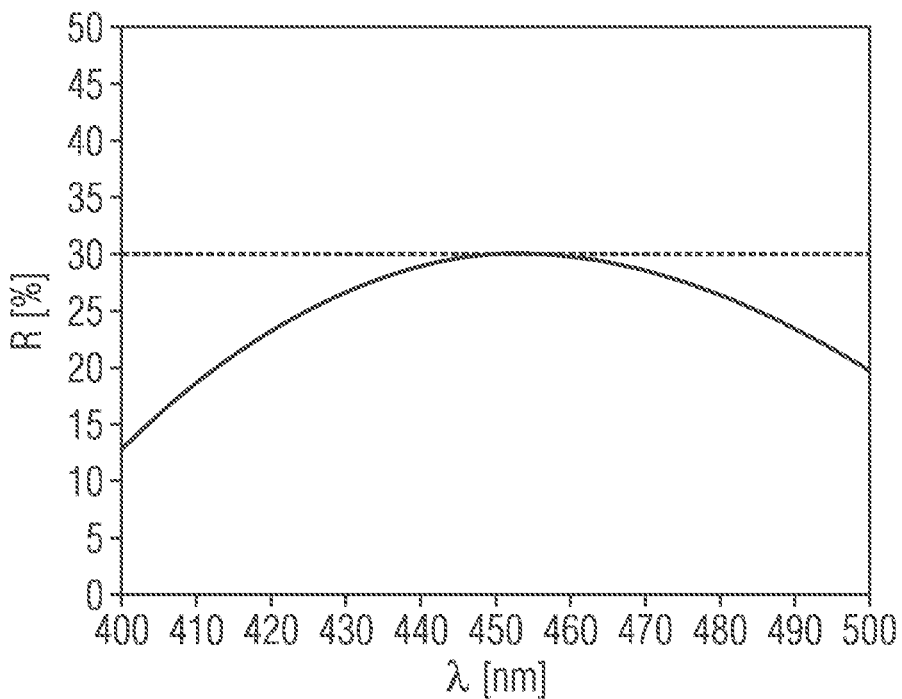
Figure 36:
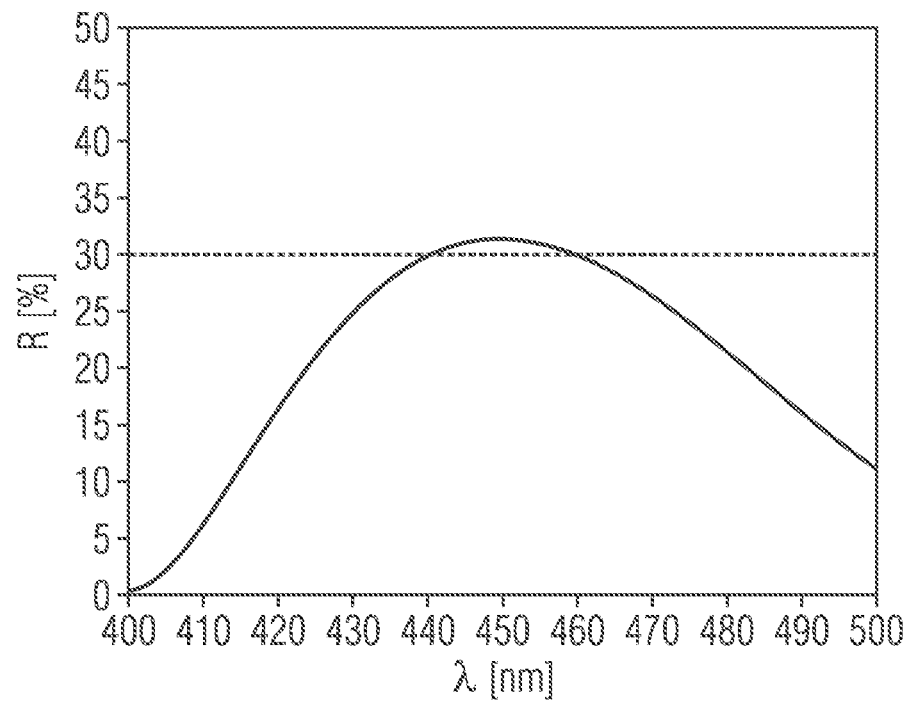
Figure 37:
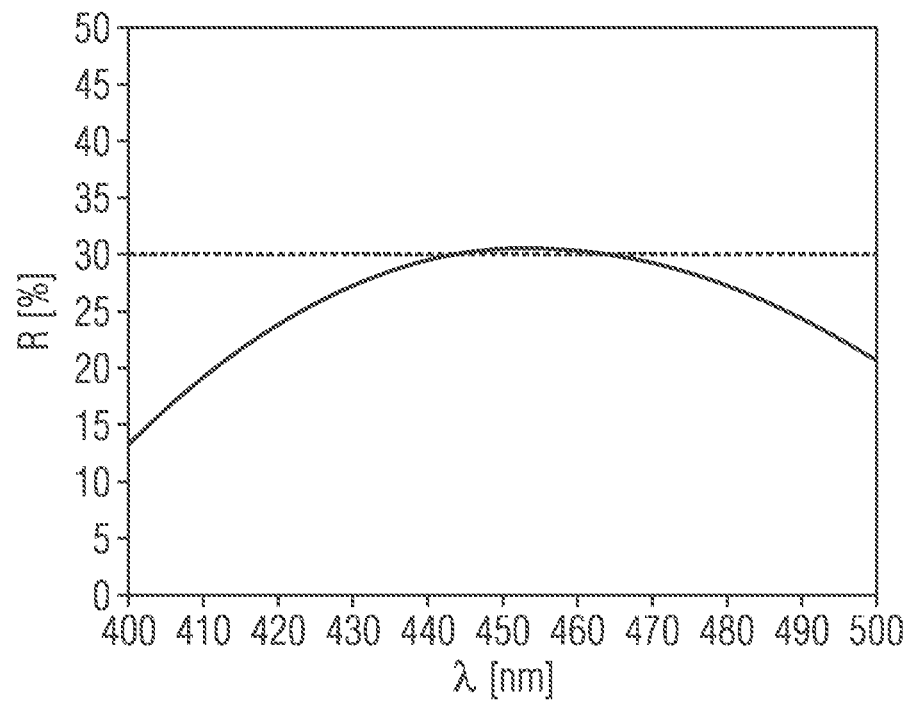

FIGS. 34, 35, 36 and 37 each show exemplary diagrams of a reflectivity R for radiation at a recess 11 with a dielectric layer 17 as a function of a wavelength λ of the radiation. Here, $n_{HL}$, is in each case approximately 2.47. In FIG. 34, the recess has a width d=570 nm, wherein a width d1 and d3 of a dielectric layer 17, e.g. SiO$_2$ with $n_M$=1.47, each has 41 nm. In FIG. 35, the recess has a width d=600 nm, wherein a width d1 of a dielectric layer 17, e.g. SiO$_2$ with $n_M$=1.47, has 9 nm and a width d3 of further dielectric layer 18, e.g. SiN with $n_M$=2.08, has 22 nm. In contrast to FIG. 35, the recess has a width d=630 nm, wherein a width d1 of a dielectric layer 17, e.g. SiO$_2$ with $n_M$=1.47, has 165 nm and a width d3 of a further dielectric layer 18, e.g. SiN with $n_M$=2.08, has 51 nm. In FIG. 37, the recess has a width d=630 nm, wherein a width d1 and d3 of a dielectric layer 17, e.g. SiN with $n_M$=2.08, each has 41 nm.

Figure 19:
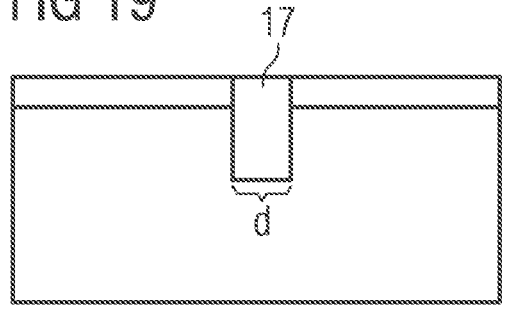
Figure 20:
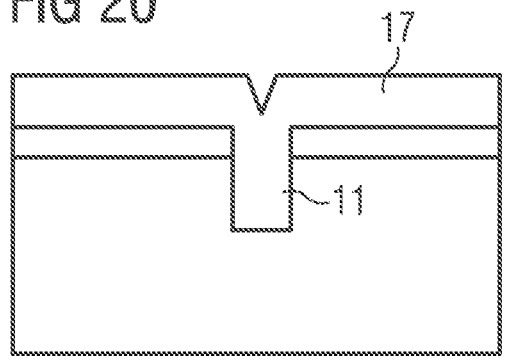
Figure 21:
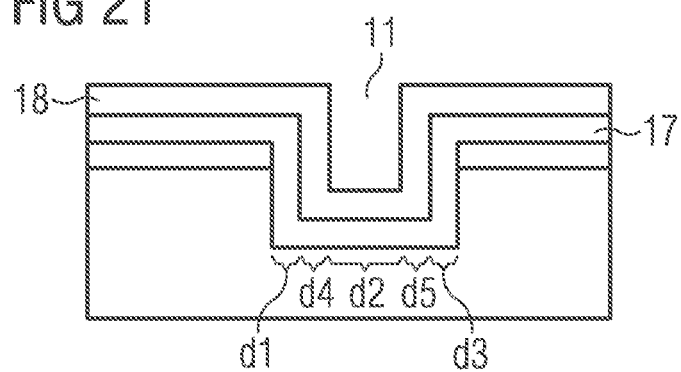
Figure 22:
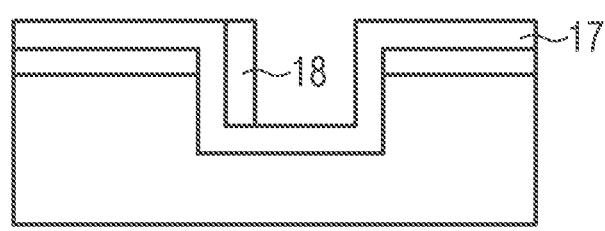
Figure 23:
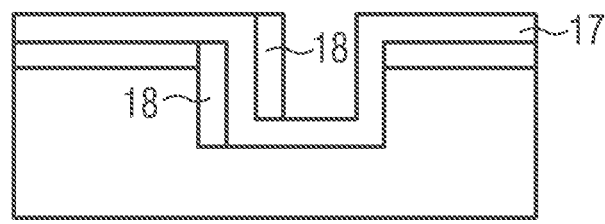
Figure 24:
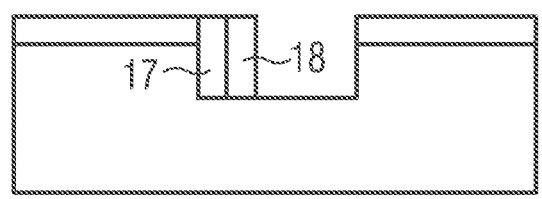
Figure 25:
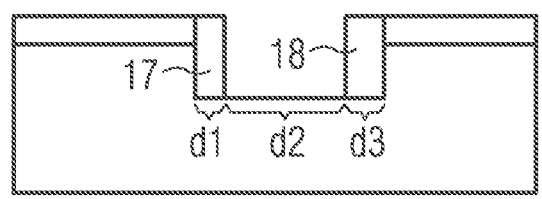
Figure 26:
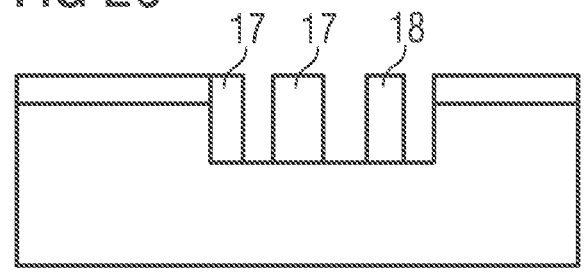
Figure 27:
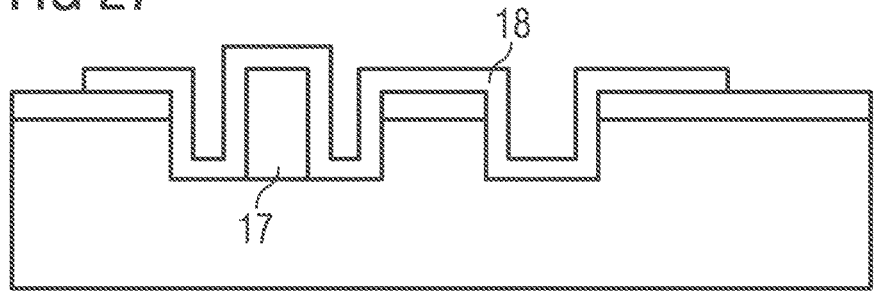
Figure 38:
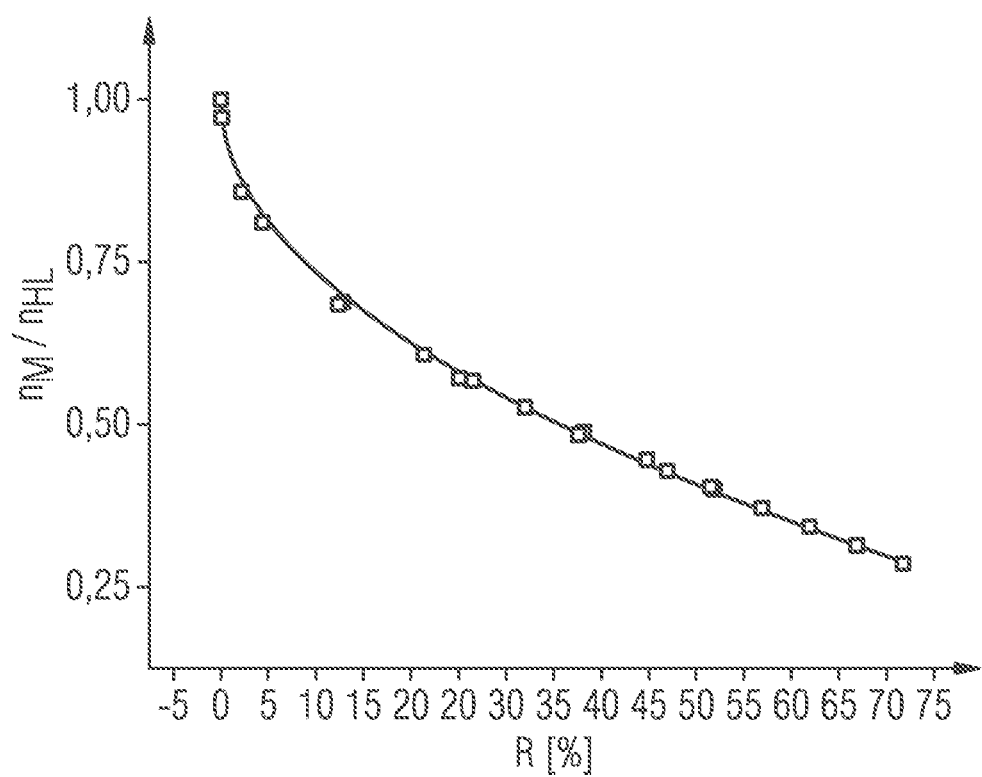

FIG. 38 shows an exemplary diagram in which a quotient of $n_M$ and $n_{HL}$ is plotted as a function of the reflectivity R. Here, the following applies $n_M/n_{HL}$=1−0.08397*sqrt(R). This relation applies to a completely filled recess 11 as shown in FIGS. 19 and 20.

Figure 39:
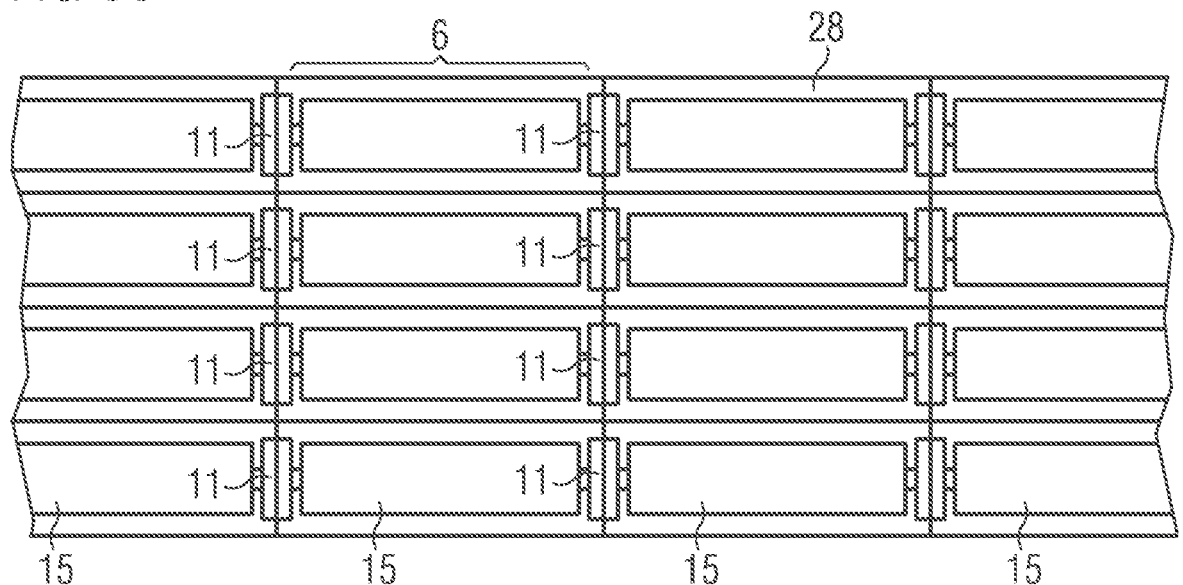
Figure 40:
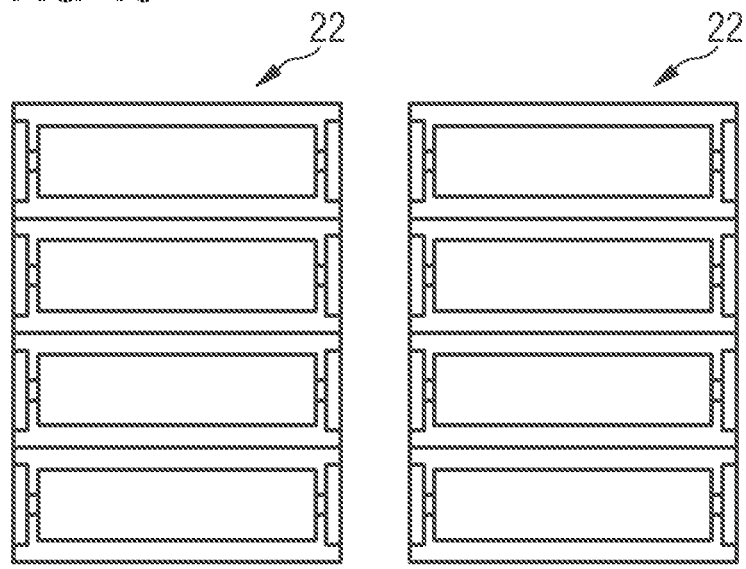

FIGS. 39 and 40 show method stages for producing a semiconductor device 22. At wafer level, first recesses 11 are initially generated in a semiconductor wafer 28. A layer stack 23 is introduced into each of the recesses 11 according to the method stages of FIGS. 41, 42, 43 and 44. Subsequently, the semiconductor wafer 28 is singulated at wafer level to form semiconductor devices 22.

For example, the semiconductor wafer 28 is singulated at wafer level into semiconductor devices 22 by sawing, laser cutting, stealth dicing, or breaking.

Figure 41:
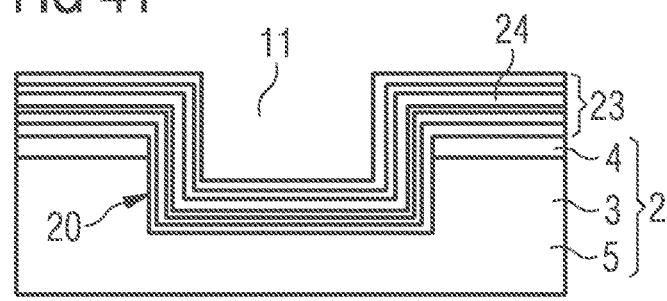

Referring to FIG. 41, a layer stack 23 is generated in the recess 11. In this embodiment, the layer stack 23 comprises six dielectric layers stacked on top of one another. On a side surface of the recess 20, the dielectric layers are stacked on top of each other in lateral directions, and on a bottom surface of the recess, the dielectric layers are stacked on top of each other in vertical directions.

For example, the dielectric layers of the layer stack 23 are successively deposited on the semiconductor body 2 by an atomic layer deposition (ALD) process or a chemical vapor deposition (CVD) process. Alternatively, the dielectric layers of the layer stack 23 can be deposited by a sputtering process or a vapor deposition process. For example, the dielectric layers can be deposited from a combination of these processes.

In this embodiment, the fourth dielectric layer of the six dielectric layers is formed as an etch stop layer 24. For example, the etch stop layer 24 comprises tantalum oxide.

Figure 42:
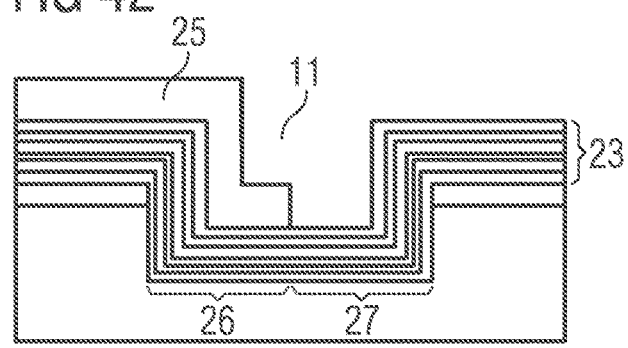

Referring to FIG. 42, a mask layer 25 is applied to the layer stack 23 to cover a first region 26 of the layer stack 23 in the recess 11. A second region 27 directly adjacent thereto is free of the mask layer 25. The mask layer 25 is, for example, a photoresist or an etch-resistant protective layer.

Subsequently, the dielectric layers of the layer stack 23 in the second region 27 are removed up to the etch stop layer 24 by means of an etching process.

Figure 43:
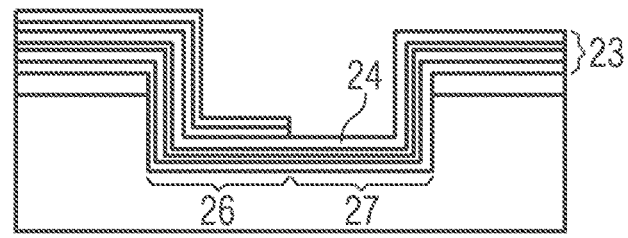

According to FIG. 43, the mask layer 25 is subsequently removed. In the first region 26, the dielectric layers of the layer stack 23 are not removed by using the mask layer 25.

The dielectric layers in the first region 26 are, for example, highly reflective for radiation generated in the active region. The dielectric layers in the second region 27 are, for example, anti-reflective for radiation generated in the active region.

Figure 44:
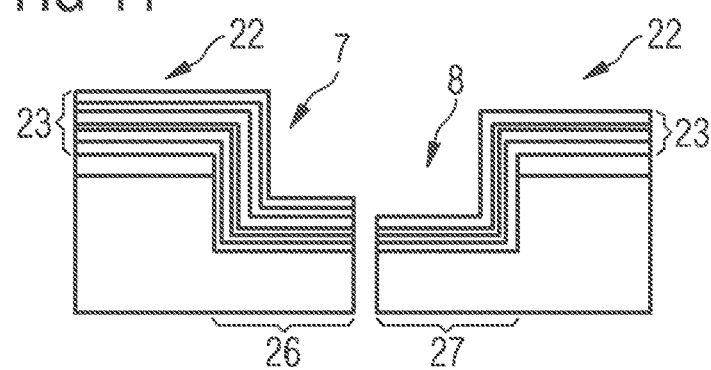

According to FIG. 44, the semiconductor chips 1 are singulated to form semiconductor devices 22. The singulation is performed by singulating the semiconductor chips 1 in the recess 11, where the first region 26 and the second region 27 are adjacent to one another.

Advantageously, a plurality of semiconductor devices 22 are thus produced, each of which has the dielectric layers at a first end region 7, which are formed highly reflective, and the dielectric layers at a second end region 8, which are formed anti-reflective. This is that a resonator can be produced advantageously in a particularly simple and precise.

The invention is not limited to the exemplary embodiments by the description based on the exemplary embodiments.

The invention claimed is:

1. A radiation emitting semiconductor chip comprising
   a semiconductor body comprising an active region configured to generate electromagnetic radiation,
   a resonator comprising a first end region and a second end region, and
   at least one recess in the semiconductor body, which completely penetrates the active region, wherein
     the active region is arranged in the resonator, and
     the recess presets a reflectivity for the electromagnetic radiation, and
   a highly reflective mirror layer is arranged on the semiconductor body in the second end region, wherein
     the recess is arranged in the first end region or the recess is arranged between the first end region and the second end region,
     a first contact layer is arranged on the semiconductor body, which is configured to impress a current into the semiconductor body,
     a second contact layer is arranged on the semiconductor body,
     the first contact layer is spaced apart from the second contact layer in lateral direction, and
     the recess is arranged between the first contact layer and the second contact layer.

2. The radiation emitting semiconductor chip according to claim 1, wherein a dielectric layer is arranged in the recess.

3. The radiation emitting semiconductor chip according to claim 2, wherein
   the dielectric layer completely covers at least one side surface of the recess, or
   the dielectric layer is spaced apart from each side surface of the recess.

4. The radiation emitting semiconductor chip according to claim 2, wherein
   a further dielectric layer is arranged on the dielectric layer, and/or
   the further dielectric layer is arranged on at least one side surface of the recess, or
   the further dielectric layer is spaced apart from each side surface of the recess.

5. The radiation emitting semiconductor chip according to claim 4, wherein a waveguide structure is arranged in the recess in which the dielectric layer and/or the further dielectric layer is arranged.

6. A radiation emitting semiconductor device comprising
   at least two radiation emitting semiconductor chips according to claim 1, wherein
   the semiconductor chips are arranged next to one another in lateral direction.

7. A method for producing a radiation-emitting semiconductor chip, comprising: providing a semiconductor body comprising an active region configured to generate electromagnetic radiation, generating a recess in the semiconductor body, which completely penetrates the active region, generating a resonator comprising a first end region and a second end region, wherein the active region is arranged in the resonator (add a comma ",") the recess presets a reflectivity for the electromagnetic radiation, a highly reflective mirror layer is arranged on the semiconductor body in the second end region, and the recess is arranged in the first end region, or the recess is arranged between the first end region and the second end region, and wherein a first contact layer is arranged on the semiconductor body, which is configured to impress a current into the semiconductor body, a second contact layer is arranged on the semiconductor body, the first contact layer is spaced apart from the second contact layer in lateral direction, and the recess is arranged between the first contact layer and the second contact layer.

8. A method for producing radiation emitting semiconductor devices, comprising:
   providing a semiconductor wafer comprising active regions each configured to generate electromagnetic radiation,
   generating recesses in the semiconductor wafer, which completely penetrate the active regions, respectively,
   generating resonators each of which comprising a first end region and a second end region, wherein one of the active regions is arranged in one of the resonators, respectively, singulating the semiconductor wafer into semiconductor devices, wherein the recesses, which are each adjacent to one of the resonators, preset a first reflectivity for the electromagnetic radiation in the first end region and preset a second reflectivity for the electromagnetic radiation in the second end region and wherein a layer stack is generated in the recesses, and the layer stack is at least partially removed in each case in a second region in the recesses.

9. The method according to claim 8, wherein a mask layer is applied to the layer stack, and the mask layer covers in each case a first region of the layer stack in the recesses.

10. The method according to claim 8, wherein the layer stack has an etch stop layer arranged between dielectric layers of the layer stack.

11. The method according to claim 9, wherein a further layer stack is generated in the recesses on the mask layer and the layer stack, and the further layer stack is completely removed in each case in the first region in the recesses.

12. The method according to claim 8, wherein the semiconductor wafer is singulated through the recesses, and the layer stack in the first regions presets in each case the first reflectivity and the layer stack in the second regions presets in each case the second reflectivity.

\* \* \* \* \*